US008004084B2

(12) United States Patent
Eda

(10) Patent No.: US 8,004,084 B2
(45) Date of Patent: Aug. 23, 2011

(54) SEMICONDUCTOR DEVICE AND MANUFACTURING METHOD THEREOF

(75) Inventor: Kentaro Eda, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 152 days.

(21) Appl. No.: 12/340,209

(22) Filed: Dec. 19, 2008

(65) Prior Publication Data

US 2009/0166750 A1 Jul. 2, 2009

(30) Foreign Application Priority Data

Dec. 21, 2007 (JP) ................................ 2007-330333

(51) Int. Cl.
*H01L 23/48* (2006.01)
*H01L 23/52* (2006.01)
*H01L 29/40* (2006.01)

(52) U.S. Cl. ................ 257/758; 257/774; 257/E23.145; 257/E21.585; 438/625; 438/629

(58) Field of Classification Search .................. 438/618, 438/622, 625, 629, 641; 257/758, 774, E23.145, 257/E23.146, E21.575, E21.585
See application file for complete search history.

(56) References Cited

U.S. PATENT DOCUMENTS 5,412,250 A * 5/1995 Brugge ........................ 438/643
5,885,857 A * 3/1999 Yamaha et al. ............... 438/129
6,225,697 B1 * 5/2001 Iguchi ........................... 257/758
2005/0191812 A1 * 9/2005 Pritchard et al. ............. 438/299
2006/0131662 A1 6/2006 Yamada et al.

FOREIGN PATENT DOCUMENTS

JP 11-340337 12/1999
JP 2006-165335 6/2006

* cited by examiner

*Primary Examiner* — Matthew Smith
*Assistant Examiner* — Quovaunda V. Jefferson
(74) *Attorney, Agent, or Firm* — Finnegan, Henderson, Farabow, Garrett & Dunner, L.L.P.

(57) ABSTRACT

A semiconductor device includes a semiconductor wafer, a source region and a drain region formed within the semiconductor wafer, a gate electrode formed on the semiconductor wafer between the source region and the drain region, an interlayer film formed on the semiconductor wafer and the gate electrode, and a dummy floating pattern embedded into the interlayer film, having a film containing metal or a metallic compound having tensile stress or compressive stress and formed to be spaced from the semiconductor wafer and the gate electrode.

18 Claims, 6 Drawing Sheets

SEMICONDUCTOR DEVICE AND MANUFACTURING METHOD THEREOF

CROSS-REFERENCE TO RELATED APPLICATION

This application is based upon and claims the benefit of priority from the prior Japanese Patent Application No. 2007-330333 filed on Dec. 21, 2007, the entire contents of which are incorporated herein by reference.

BACKGROUND OF THE INVENTION

The present invention relates to a semiconductor device, such as a CMOS-FET (Complementary Metal Oxide Semiconductor Field Effect Transistor) and the manufacturing method thereof.

In recent years, with needs of further miniaturization and higher functionality of electronic devices, for example, enhancement of carrier mobility has been studied to increase a driving force in a CMOS-FET for configuring a SRAM (Static Random Access Memory) cell.

It has been known that the carrier mobility depends upon a wafer plane orientation or an axial direction to be used or stress such as lattice strain, and the direction of the enhancement or degradation thereof is different between an n-type MOS-FET with an electron as a carrier and a p-type MOS-FET with a hole as a carrier. For example, if a <110> axial direction of a Si wafer (100) face is taken as a channel longitudinal direction, tensile stress is applied for an N-type MOS-FET and compressive stress is applied for a P-type MOS-FET, in the channel longitudinal direction (X-direction) and a direction (Z-direction) perpendicular to a wafer face, respectively. In a channel width direction (Y-direction), tensile stress is applied to each thereof. Application of such stress can enhance carrier mobility.

As an approach to each stress application, there have been proposed an approach to applying tensile stress by forming an SiN film having tensile stress at an isolation part of STI (Shallow Trench Isolation), an approach to applying compressive stress by epitaxially growing a SiGe layer having a higher lattice constant than Si and an approach to forming an insulation film having tensile stress or compressive stress on an electrode.

There has been also used an approach to applying stress suitable to respective elements by individually preparing the respective elements one by one, as disclosed in Japanese Patent Application Laid-Open No. 11-340337 and Japanese Patent Application Laid-Open No. 2006-165335. However, necessity of the individual preparation process causes inconveniences such as an increasing of the number of processes and affects on peripheral processes.

SUMMARY

According to an aspect of the present invention, there is provided a semiconductor device comprising: a semiconductor wafer; a source region and a drain region formed within the semiconductor wafer; a gate electrode formed on the semiconductor wafer between the source region and the drain region; an interlayer film formed on the semiconductor wafer and the gate electrode; and a dummy floating pattern embedded into the interlayer film, the dummy floating pattern having a film containing metal or a metallic compound having tensile stress or compressive stress, and the dummy floating pattern formed to be spaced from the semiconductor wafer and the gate electrode.

According to an aspect of the present invention, there is provided a manufacturing method of a semiconductor comprising: forming a gate electrode on a semiconductor wafer; forming an active area within the semiconductor wafer; forming an interlayer film on the active area and the gate electrode; forming a first opening portion reaching the semiconductor wafer or the gate electrode and a second opening portion to be spaced from the semiconductor wafer and the gate electrode in the interlayer film; embedding a first film including metal or a metallic compound into the first opening portion and forming a via contact; and embedding a second film including metal or a metallic compound same as or different from the metal or the metallic compound of the first film into the second opening portion, and forming a dummy floating pattern having tensile stress or compressive stress.

DETAILED DESCRIPTION

Figure 1:
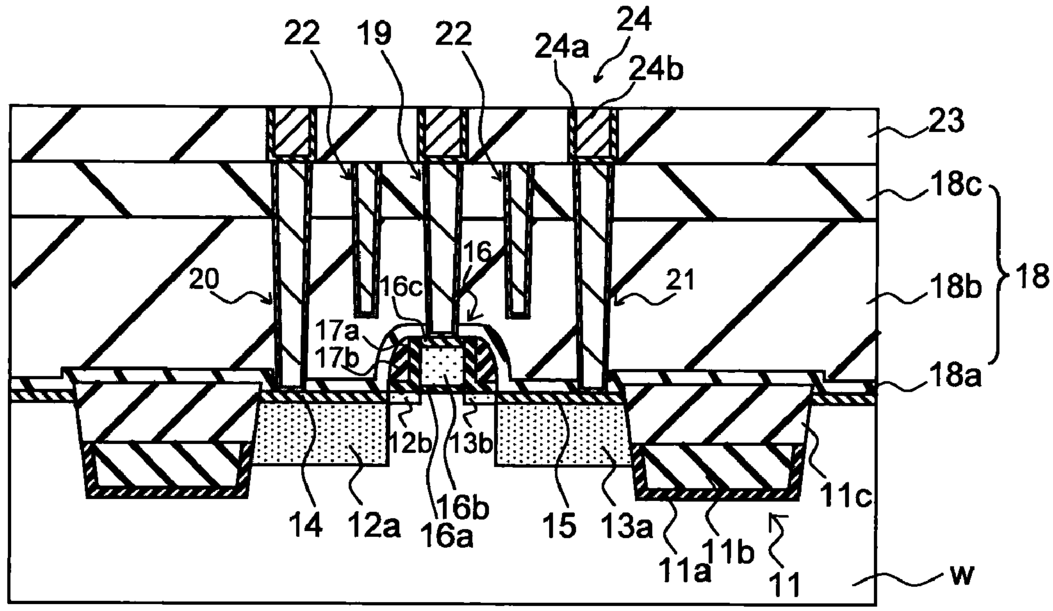
FIG. 1 is a sectional view illustrating a MOSFET cell in a semiconductor device according to one aspect of the present invention.

Reference will now be made in detail to the present embodiment of the invention, an example of which is illustrated in the accompanying drawings. Wherever possible, the same reference numbers will be used throughout the drawing to refer to the same or like parts.

FIG. 1 is a sectional view illustrating a MOSFET cell in a semiconductor device according to the present embodiment. As illustrated in FIG. 1, as a semiconductor wafer, for example, a wafer w such as a bulk Si wafer, a SiGe wafer, or an SOI (Silicon On Insulator) wafer is used. The wafer w is subjected to element separation by STI 11 containing, for example, LP (Low Pressure)-SiN film 11*a*, TEOS (Tetraethoxysilane) film 11*b* and TEOS film 11*c* and tensile stress is provided by a SiN film 11*a*.

Respective regions which have been subjected to element separation are formed with an active area having a source region 12*a*, a drain region 13*a* and LDDs (Lightly Doped Drain) 12*b*, 13*b*, spaced from each other. On surfaces of the source region 12*a* and the drain region 13*a*, there are formed silicide layers 14, 15 containing Ni or the like, respectively. On a region between the source region 12*a* and the drain region 13*a*, there is formed a gate electrode 16 containing a poly-silicon layer 16*b* and a silicide layer 16*c* formed through the gate insulation film 16*a*. In the gate electrode 16, there are formed gate side walls containing insulation films 17*a* containing TEOS (tetraethoxysilane) or the like and LP-SiN films 17*b*.

On these upper layers, there is formed an interlayer film 18 containing, for example, an SiN film 18*a*, a P-SiN film 18*b* and a TEOS film 18*c*, tensile stress is provided by the SiN film 18*a*. To penetrate through the interlayer film 18, there are formed a via contact 19 reaching the gate electrode 16 and via contacts 20, 21 reaching the silicide layers 14, 15, respectively. Between the via contact 19 and the via contacts 20, 21, there is formed dummy floating patterns 22 spaced from the active area.

The via contacts 19, 20, 21 and the dummy floating patterns 22 are constructed from a barrier metal film containing titanium and a metal film containing tungsten or the like, respectively. Tensile stress is provided by the dummy floating patterns 22.

Further, on the via contacts 19, 20, 21, there is formed a wiring 24 containing a barrier metal film 24*a* containing Ti or the like and a Cu film 24*b*, which are separated by an interlayer film 23.

Figure 2:
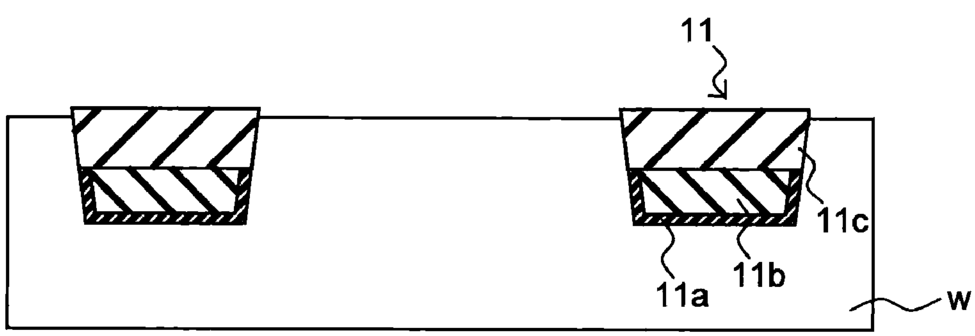
FIG. 2 through 5 are views illustrating one manufacturing process of a MOSFET cell according to an aspect of the present invention.

The semiconductor device described above is formed as stated below. As illustrated in FIG. 2, on a wafer w, an SiN film is formed, for example, 150 nm by LPCVD (Low Pressure Chemical Vapor Deposition) method. A resist film is applied onto the SiN film and a resist pattern is formed by a lithographic technique. With the resist pattern as a mask, the SiN film is etched using RIE (Reactive Ion Etching) method. Subsequently, the wafer w is etched, for example, 300 nm and the resist pattern is removed to form a STI trench.

Using LPCVD method, an SiN film serving as the SiN film 11*a* is formed, for example, 20 nm, an insulation film such as a TEOS film serving as the isolation film 11*b* is deposited over the whole surface thereof to embed the STI trench. The embedded trench is etched back to a determined depth, so that a part of the SiN film 11*a* is exposed and the exposed portion is removed by etching.

An insulation film such as a TEOS film serving as the isolation film 11*c* is deposited over the whole surface. With the SiN film as a stopper film, a surface thereof is flattened using CMP (Chemical mechanical polishing) method.

The insulation film 11*c* is then etched by, for example, 100 nm so that the top face thereof matches a predetermined height from the surface of the wafer w. All the SiN film on the surface of the wafer w is removed by etching to be formed STI 11.

Figure 3:
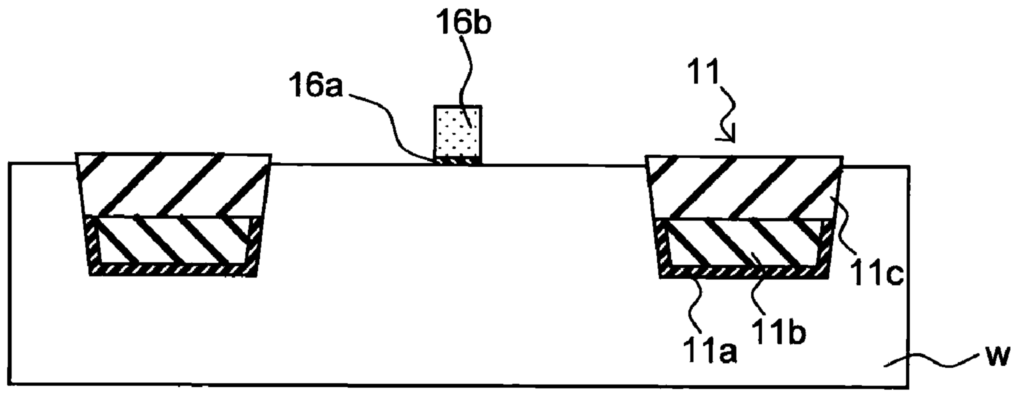

As illustrated in FIG. 3, to form a P-type or N-type device region, impurity is injected into the wafer w. When heat treatment is performed, for example, at 1,000° C., a P-type or N-type well and a channel region is formed w within the surface side of the wafer w.

On the wafer w, an insulation film serving as the gate insulation film 16*a* is formed, for example, 1 nm. Using a LPCVD method, poly-silicon serving as the poly-silicon layer 16*b* constituting the gate electrode 16 is formed, for example, 150 nm.

A resist film is applied onto poly-silicon and a resist pattern is formed using the lithographic technique. With the resist pattern as a mask, poly-silicon is etched using the RIE method. By removing the resist pattern, the poly-silicon layer 16*b* constituting the gate electrode 16 is formed. All the exposed insulation film is removed by wet-etching to be formed the gate electrode 16.

Figure 4:
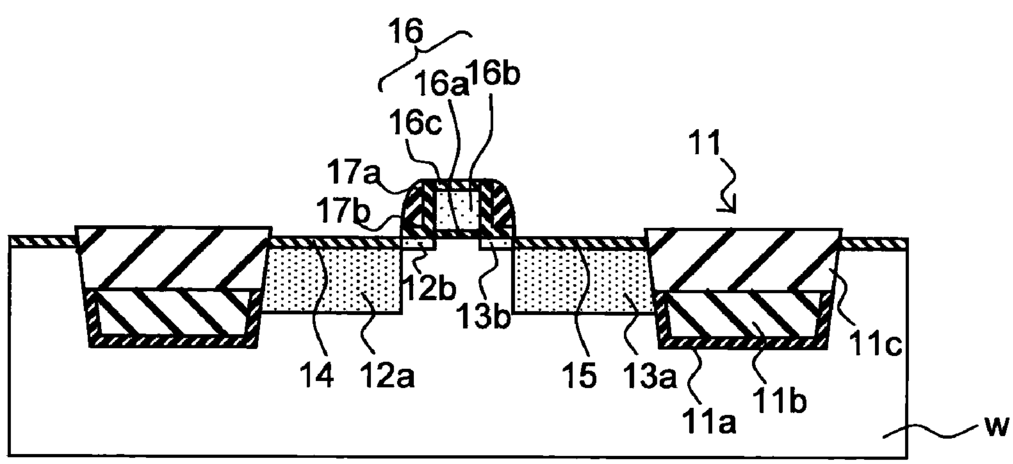

As illustrated in FIG. 4, impurity is injected into the P-type or N-type well and the channel region. When heat treatment is performed, for example, at approximately 800° C., a shallow impurity diffusion region which becomes LDD12*b*, LDD13*b* is formed. After an insulation film is formed all over, for example, 20 nm using the LPCVD method, a SiN film is formed all over using the LPCVD method. By performing etching-back using the RIE method, gate side walls containing the insulation film 17*a* and the SiN film 17*b* are formed on the gate electrode 16.

Impurity is injected into the gate electrode 16 and well and channel and diffusion regions. When heat treatment is performed, for example, at a temperature of at least 1,000° C., the source region 12*a*, the drain region 13*a* and LDDs 12*b*, 13*b* are formed. Using the salicide method, the silicide layers 14, 15, 16*c* are selectively formed on surfaces of the source region 12*a*, the drain region 13*a* and the poly-silicon layer 16*b*, respectively.

Figure 5:
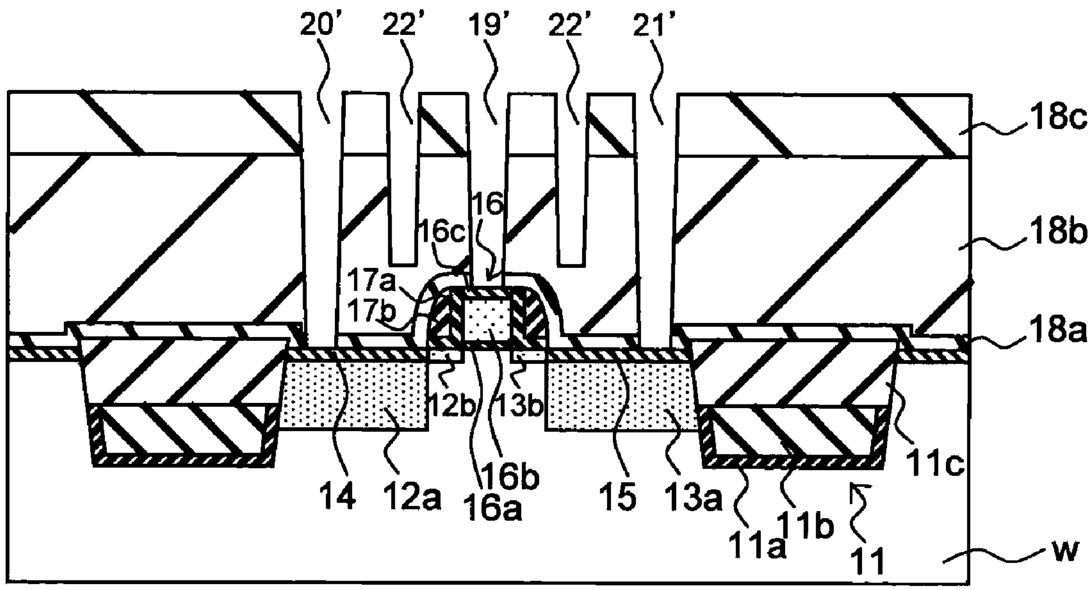

As illustrated in FIG. 5, the SiN film 18*a* is formed all over, for example, 30 nm using the LPCVD method. On the SiN film 18*a*, an insulation film such as a P-SiN film is formed, for example, 400 nm, using the LPCVD method. By flattening the surface using the CMP method, the insulation film 18*b* is formed. Using the plasma CVD method, the insulation film 18*c* such as a TEOS film is formed, for example, 200 nm on the insulation film 18*b*.

Figure 6:
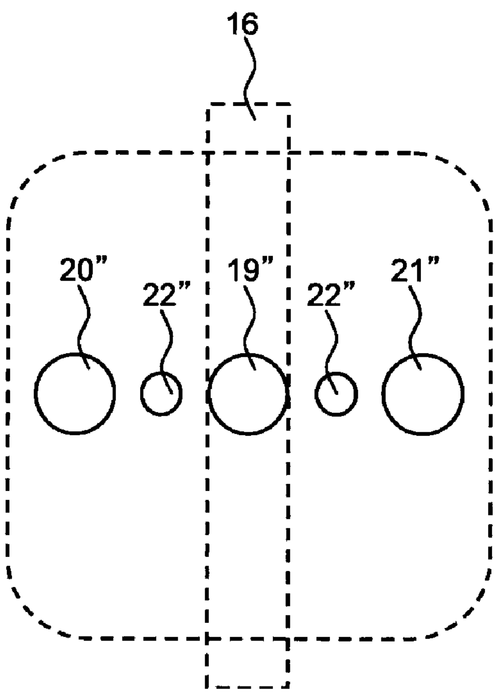
FIG. 6 is a view illustrating one arrangement of a resist pattern according to an aspect of the present invention.

A resist film is applied onto the insulation film 18*c* and a resist pattern is formed using the lithographic technique. As shown in FIG. 6, the resist patterns to be formed are resist patterns of via contacts 19", 20" and 21", and resist patterns of each of the dummy floating patterns 22", which are hole patterns disposed between the resist pattern of the contact hole 19" and that of the contact hole 20", and between the resist pattern of the contact hole 19" and that of the contact hole 21". Short sides of resist patterns of the dummy floating patterns 22 are shorter than that of a resist pattern of each of the via contacts 19", 20" and 21", is set at 1/10 as large as the film thickness of an interlayer film containing the SiN film 18*a*, the insulation film 18*b* and the insulation film 18*c* and has a dimension of a processing limit or less. With such a resist pattern as a mask, the insulation film 18*c*, the insulation film 18*b* and the SiN film 18*a* are etched using the RIE method.

The resist pattern is removed, there are formed contact holes 19', 20', 21' and a dummy floating hole 22', which are opening portions. The dummy floating holes 22', the short side of which is formed in a dimension of the processing limit or less, is etch-stopped midway of the insulation film 18*b* without reaching the active area.

Figure 7:
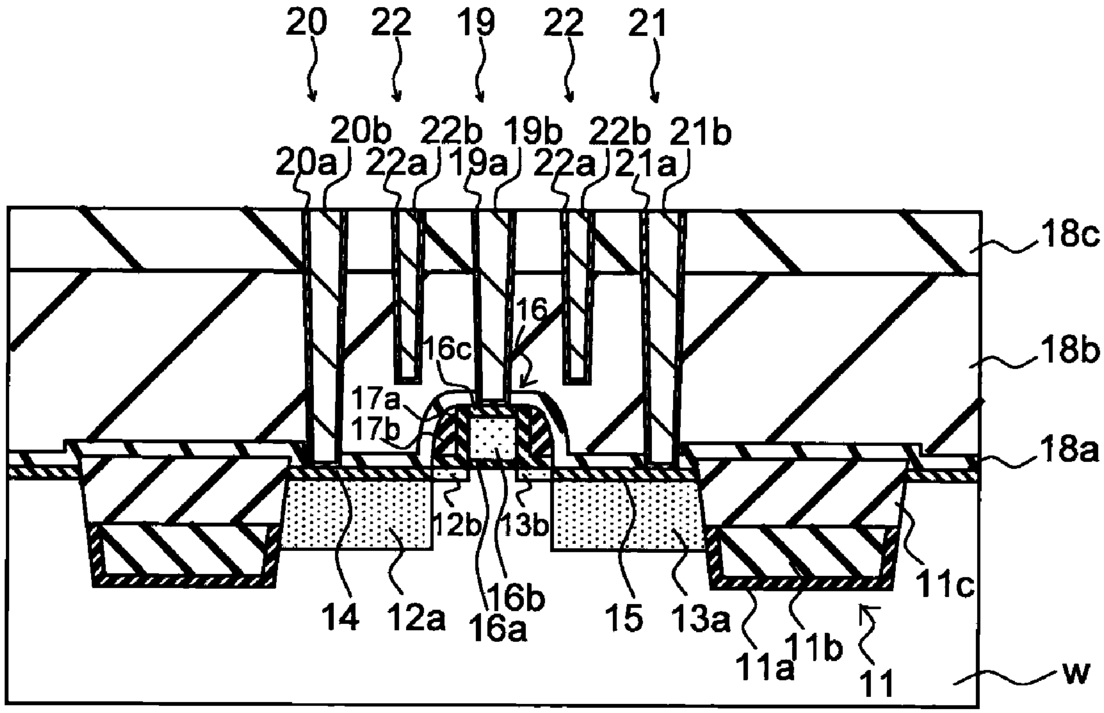
FIG. 7 is a view illustrating one manufacturing process of a MOSFET cell according to an aspect of the present invention.

As illustrated in FIG. 7, a barrier metal film containing titanium or the like serving as each of the barrier metal films 19*a*, 20*a*, 21*a*, 22*a* is formed using the sputter method. When a metal film containing tungsten or the like serving as each of the metal films 19*b*, 20*b*, 21*b*, 22*b* is formed on the barrier metal film, contact holes and dummy floating holes are embedded.

By removing the metal film and the barrier metal film on the insulation film 18*c* using the CMP method, the via contacts 19, 20, 21 reaching the silicide layers 14, 15, 16*c* respectively and the dummy floating patterns 22 spaced from the active area are formed in the via contact holes 19', 20', 21' and the dummy floating hole 22'. The barrier metal films 22*a* and the metal films 22*b* in the dummy floating patterns 22 have tensile stress.

On the insulation film 18*c* and the via contacts 19, 20, 21 and the dummy floating patterns 22, there is formed an insulation film serving as the interlayer film 23, for example, 200 nm, using a plasma CVD method. A resist film is applied onto the insulation film and a resist pattern is formed using the lithographic technique. With the resist pattern as mask, the insulation film is etched using RIE method. The resist pattern is removed and an interlayer film 23 and the trench are formed.

A barrier metal film containing titanium or the like serving as the barrier metal film 24*a* is formed. On the barrier metal film, a Cu film 24*b* is formed on the barrier metal film using a plating method to embed the trench. By removing the Cu film and the barrier metal film on the insulation film 18*c* using the CMP method, a wiring 24 including the barrier metal film 24*a* and the Cu film 24*b* is formed in the trench.

A semiconductor device as illustrated in FIG. 1 is formed in this way. By applying voltages to metal pads formed on the wirings, the semiconductor device can be operated.

By forming a dummy floating pattern having tensile stress near the gate electrode in this way, tensile stress can be applied to the proximity of the gate electrode. By applying tensile stress, carrier mobility can be improved, which leads to improvement of a driving force of a semiconductor device such as a CMOS-FET.

Figure 8:
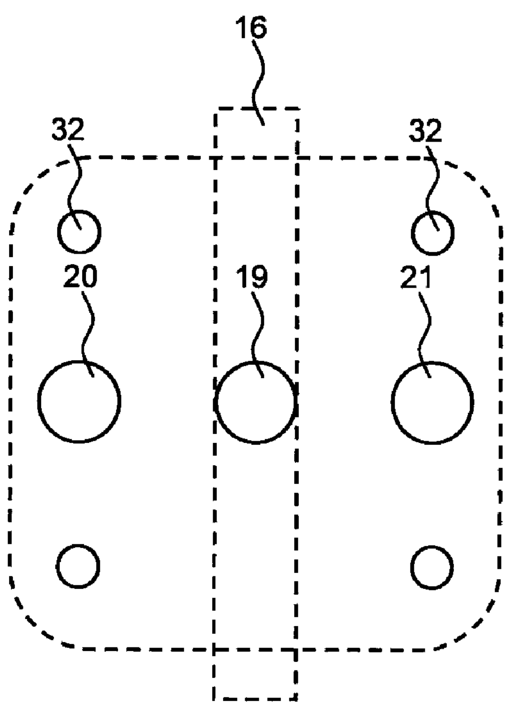
FIG. 8 through 10 are views illustrating one arrangement of a dummy floating pattern according to an aspect of the present invention.

In the present embodiment, the dummy floating pattern 22 is disposed between the via contact 19 and the via contacts 20, 21, respectively, but it is sufficient to dispose the dummy floating pattern so as to effectively apply stress to the proximity of the gate electrode and a shape of the dummy floating pattern is not particularly limited. For example, as illustrated in FIG. 8, a hole-like dummy floating pattern 32 may be disposed so as to sandwich the via contact 19 and the via contacts 20, 21.

Figure 9:
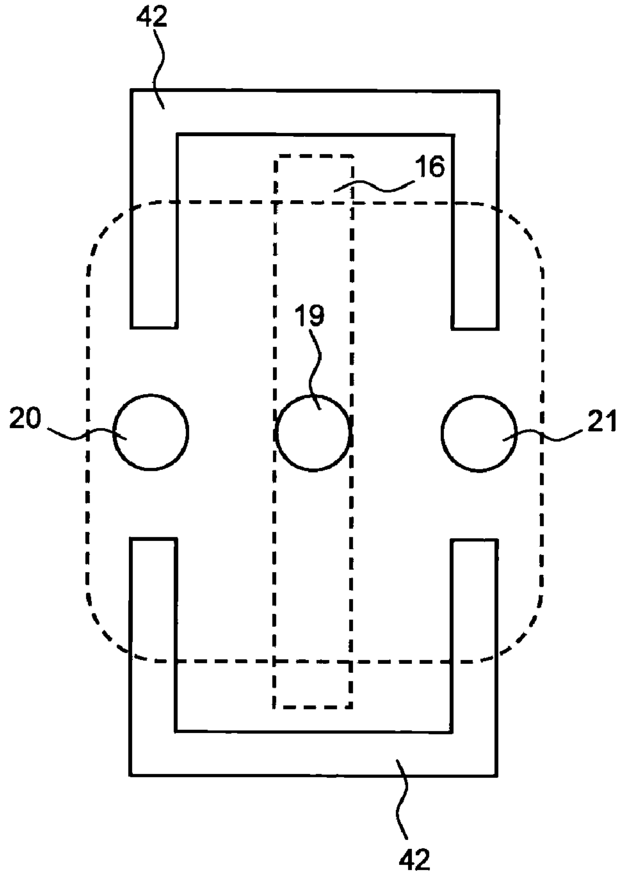

The dummy floating pattern may be of a trench shape. For example, as illustrated in FIG. 9, a trench-like dummy floating patterns 42 may be disposed so as to sandwich the via contact 19 and the via contacts 20, 21 and surround the gate electrode 16. The trench-like dummy floating pattern may be disposed so as to sandwich the gate electrode.

Figure 10:
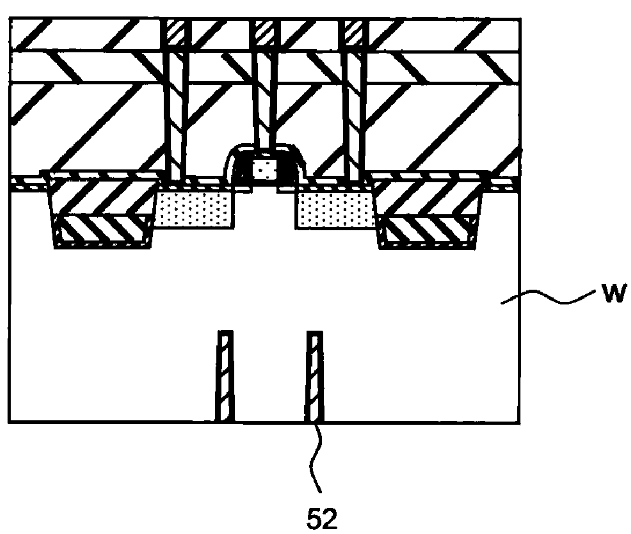

The dummy floating pattern always does not need to be formed on a surface on which the active area is formed. For example, as illustrated in FIG. 10, a dummy floating pattern 52 may be disposed on the rear surface side of the wafer w on which no element is formed. Further, a combination of these arrangement or shapes may be used.

In the present embodiment, as a film for internal dummy floating pattern which applies tensile stress, a titanium film and a tungsten film was used, but is not limited to the titanium film and tungsten film. For example, in addition to the titanium film and the tungsten film, titanium oxide film, titanium nitride film, tantalum film, tantalum oxide film, tantalum nitride film, aluminum film and Cu film may be used in a single layer or laminated layer.

In the present embodiment, tensile stress was applied by the dummy floating pattern, but compressive stress may be applied by the dummy floating pattern. By the dummy floating pattern, either stress of tension or compression is applied, depending upon material, film thickness, layer configuration and formation process. Accordingly, by using, for example, a Cu film as a film of the internal dummy floating pattern, or by changing, as needed, the film thickness, layer configuration or formation process of the above-described titanium film, tungsten film, titanium oxide film, titanium nitride film, tantalum film, tantalum oxide film, tantalum nitride film or aluminum film, compressive stress can be applied to the proximity of a gate electrode, or stress can be relieved.

For example, in C-MOSFET, by applying tensile stress to an n-type active device region and compressive stress to a p-type active device region in the above way, respectively, carrier mobility can be improved in each of the regions. As described above, because the stress to be applied depends upon a plane direction of the wafer, the dummy floating pattern can be formed so that either stress of tensile stress or compressive stress is applied in a direction suitable to the plane direction as needed.

In the present embodiment, a dummy floating hole is formed concurrently with the via contact with the film of the internal dummy floating hole having the same configuration as the via contact. This does not always need the same configuration or concurrent formation. However, concurrent formation allows providing stress to the proximity of the gate electrode without increasing the number of processes.

Figure 11:
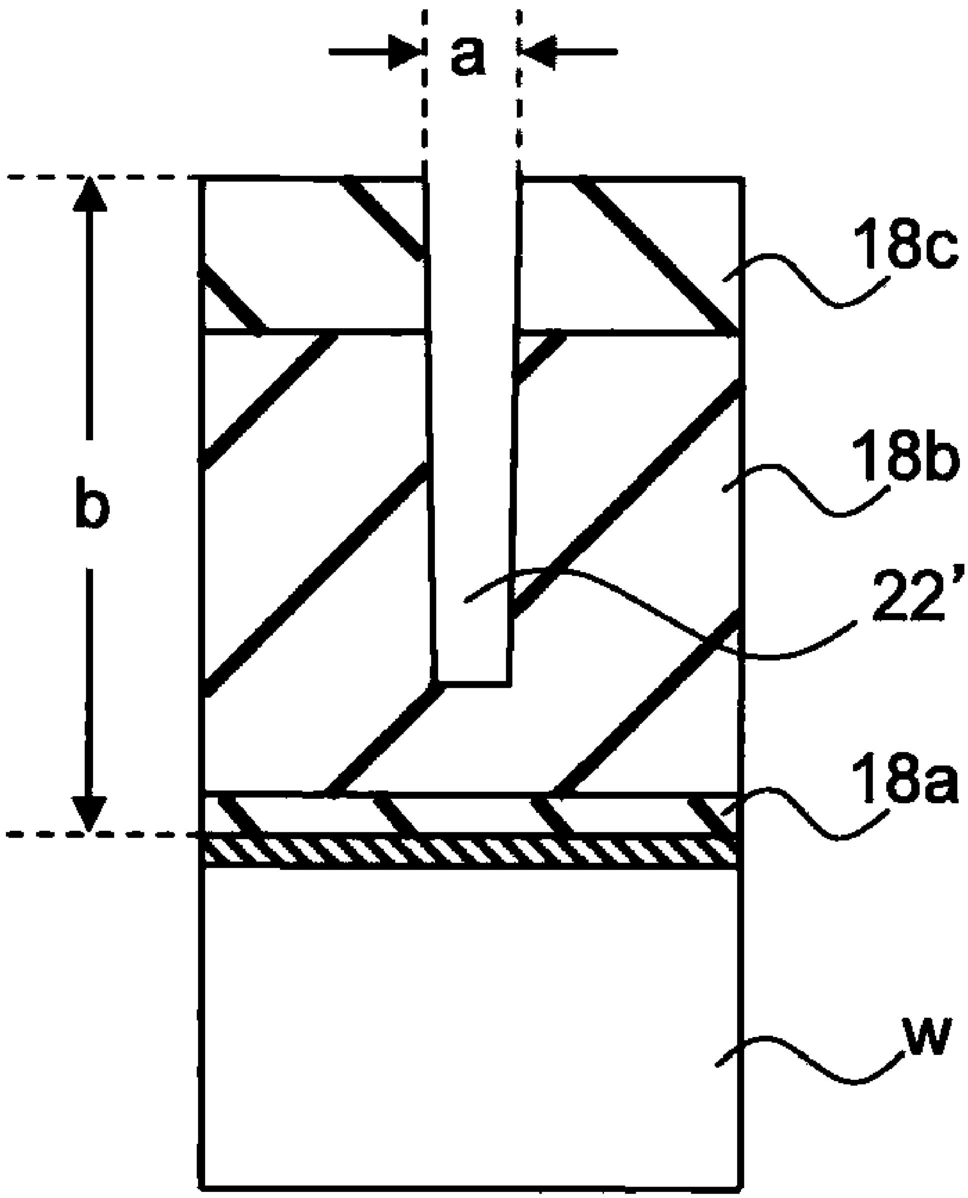
FIG. 11 is a sectional view illustrating to describe a short side of a dummy floating hole a and a thickness of an interlayer film b.

In the present embodiment, because the dummy floating hole and the via contact are concurrently formed, as illustrated in FIG. 11, a short side 'a' of a dummy floating hole 22' is defined as 1/10 as large as a film thickness 'b' of an interlayer film containing a SiN film 18*a*, an insulation film 18*b* and an insulation film 18*c* in which via contacts are open. When a ratio a/b of the short side to the film thickness of an interlayer film is defined as 1/10, the dimension is a processing limit or less. Hence, in the dummy floating hole, the depth thereof is controlled so as not to reach an active area.

For the dummy floating hole not to reach the active area, preferably, a ratio (a/b) of a short side of the dummy floating pattern to a film thickness of the interlayer film is 1/6 or less. In view of variations in process, more preferably, the ratio is 1/7.5 or less. On the other hand, too large ratio causes the dummy floating hole to be too shallow, making it difficult to effectively apply stress to the proximity of the gate electrode. Preferably, the rate is 1/10 or more.

An approach to concurrent formation of the dummy floating pattern and the via contact is not limited to defining the dimensional ratio of a short side of the dummy floating pattern. Use of a multi-tone mask such as graytone and halftone enables such a control as to obtain a depth different from that of the via contact hole. Other various types of approaches to changing an etching depth are available.

Preferably, the dummy floating pattern is formed up to as close proximity of the gate electrode as possible in order to apply stress to the proximity of the gate electrode. However, stress is released upon reaching the gate electrode or the active area, and therefore, the depth is required not so deep as to reach. In view of an alignment error in a process, a bottom portion of the dummy floating pattern can be located so as to obtain, for example, a position from 1.3 times to 2.2 times as large as a height of the gate electrode. Preferably, the position is from 1.5 times to 2.0 as large as the height of the gate electrode. The bottom portion may be formed up to a position lower than a height of the gate electrode.

In the present embodiment, the interlayer film is formed on the dummy floating pattern and is in a non-conductive state relative to an upper layer wiring (multi-layer wiring), but may be connected with the upper layer wiring (multi-layer wiring). This is because there is found no electrical failure without any adverse effect upon stress application to the proximity of the gate electrode whether the wiring is in a conductive state or not. Accordingly, arrangement of the upper layer wiring can be determined as necessary without being affected by arrangement of the dummy floating pattern.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device comprising:

a semiconductor wafer;

a source region and a drain region formed within the semiconductor wafer;

a gate electrode formed on the semiconductor wafer between the source region and the drain region;

an interlayer film formed on the semiconductor wafer and the gate electrode; and dummy floating patterns embedded into the interlayer film, the dummy floating patterns having a film containing metal or a metallic compound having tensile stress or compressive stress, and the dummy floating patterns formed to be spaced from the semiconductor wafer and the gate electrode, wherein the semiconductor wafer has a first region formed with an n-type active device and a second region formed with a p-type active device, and the dummy floating patterns include:

a first dummy floating pattern formed in the first region and having tensile stress; and a second dummy floating pattern, constructed from a film different from the first dummy floating pattern and having compressive stress or tensile stress.

2. The semiconductor device according to claim 1, further comprising via contacts individually reaching the source region, the drain region and the gate electrode and the via contacts having a film containing the same metal or metallic compound as the dummy floating patterns.

3. The semiconductor device according to claim 2, wherein a short side of the dummy floating patterns is shorter than that of the via contact.

4. The semiconductor device according to claim 1, wherein a ratio of a length of a short side of the dummy floating patterns to a film thickness of the interlayer film is 1/6 or less.

5. The semiconductor device according to claim 4, wherein the ratio of the length of a short side of the dummy floating patterns to the film thickness of the interlayer film is 1/7.5 or less.

6. The semiconductor device according to claim 5, wherein the ratio of the length of the short side of the dummy floating patterns to the film thickness of the interlayer film is 1/10 or less.

7. The semiconductor device according to claim 1, wherein the interlayer film is a laminated film.

8. The semiconductor device according to claim 1, wherein the dummy floating patterns have a hole shape and are disposed to sandwich the gate electrode between the dummy floating patterns.

9. The semiconductor device according to claim 1, wherein the first dummy floating pattern and the second dummy floating pattern are of hole shapes or of trench shapes.

10. The semiconductor device according to claim 9, wherein the trench shape is formed to surround the gate electrode.

11. A manufacturing method of a semiconductor comprising:

forming a gate electrode on a semiconductor wafer;

forming an active area within the semiconductor wafer;

forming an interlayer film on the active area which has a first region formed with an n-type active device and a second region formed with a p-type active device and the gate electrode;

forming a first opening portion reaching the semiconductor wafer or the gate electrode and a second opening portion to be spaced from the semiconductor wafer and the gate electrode in the interlayer film on the first region, and a third opening portion reaching the semiconductor wafer or the gate electrode and a fourth opening portion to be spaced from the semiconductor wafer and the gate electrode in the interlayer film on the second region;

embedding a first film including metal or a metallic compound into the first opening portion and a second film including metal or a metallic compound into the third opening portion, and forming a via contact;

embedding a third film including metal or a metallic compound same as or different from the metal or the metallic compound of the first film into the second opening portion, and forming a first dummy floating pattern having tensile stress and embedding a fourth film including metal or metallic compound same as or different from the metal or the metallic compound of the second film into the fourth opening portion, and forming a second dummy floating pattern having compressive stress.

12. The manufacturing method according to claim 11, wherein the first opening portion and the second opening portion are concurrently formed.

13. The manufacturing method according to claim 11, wherein the via contact and the first dummy floating pattern are concurrently formed.

14. The manufacturing method according to claim 11, wherein a short side of the first dummy floating pattern is shorter than a short side of the via contact.

15. The manufacturing method according to claim 11, wherein a ratio of a length of a short side of the first dummy floating pattern to a film thickness of the interlayer film is 1/6 or less.

16. The manufacturing method according to claim 11, wherein the interlayer film is a laminated film.

17. The manufacturing method according to claim 11, wherein the first dummy floating pattern and the second dummy floating pattern are of hole shapes or of trench shapes.

18. The manufacturing method according to claim 17, wherein the hole shapes provided are disposed to sandwich the gate electrode between the dummy floating patterns.

* * * * *